(12) United States Patent
Kawase (10) Patent No.: US 7,820,362 B2
(45) Date of Patent: Oct. 26, 2010

(54) METHOD OF PATTERN DELINEATION

(75) Inventor: Yuichi Kawase, Tokyo (JP)

(73) Assignee: JEOL Ltd., Tokyo (JP)

( * ) Notice: Subject to any disclaimer, the term of this patent is extended or adjusted under 35 U.S.C. 154(b) by 428 days.

(21) Appl. No.: 12/030,625

(22) Filed: Feb. 13, 2008

(65) Prior Publication Data

US 2008/0193881 A1      Aug. 14, 2008

(30) Foreign Application Priority Data

Feb. 13, 2007    (JP) .............................. 2007-31976

(51) Int. Cl.
*G03C 5/00* (2006.01)
*G03F 9/00* (2006.01)

(52) U.S. Cl. .................. 430/296; 430/30; 430/942; 250/492.22; 250/492.3

(58) Field of Classification Search .................. 430/30, 430/296, 942; 250/492.22, 492.3
See application file for complete search history.

(56) References Cited

U.S. PATENT DOCUMENTS 6,060,716 A    5/2000    Kawase

*Primary Examiner*—Christopher G Young
(74) *Attorney, Agent, or Firm*—The Webb Law Firm (57) ABSTRACT

A method of delineating a lithographic pattern on a material. A pattern to be delineated is divided according to first and second fields by first and second methods of division. Pattern segments contained in the first fields are divided in the X-direction, and data about the resulting pattern subsegments is obtained. Pattern segments contained in the second fields are divided in the Y-direction, and data about the resulting pattern subsegments is obtained. The two methods are so carried out that a pattern segment located across a field boundary during implementation of one of the two methods of division is located around the center of a field during implementation of the other method. In each field, the pattern segments obtained by the X division and Y division, respectively, are overlapped and written with a half of the dose normally used.

2 Claims, 8 Drawing Sheets

METHOD OF PATTERN DELINEATION

BACKGROUND OF THE INVENTION

1. Field of the Invention

The present invention relates to a method of pattern delineation and, more particularly, to a method of delineating a pattern while less affected by beam deflection distortion.

2. Description of Related Art

In a charged-particle beam lithography system, such as an electron-beam lithography system, a charged-particle beam is directed at a given position on a material on which a pattern is to be delineated according to data about the pattern, the material being coated with a photosensitive material. Thus, the pattern to be delineated is written.

Figure 5:
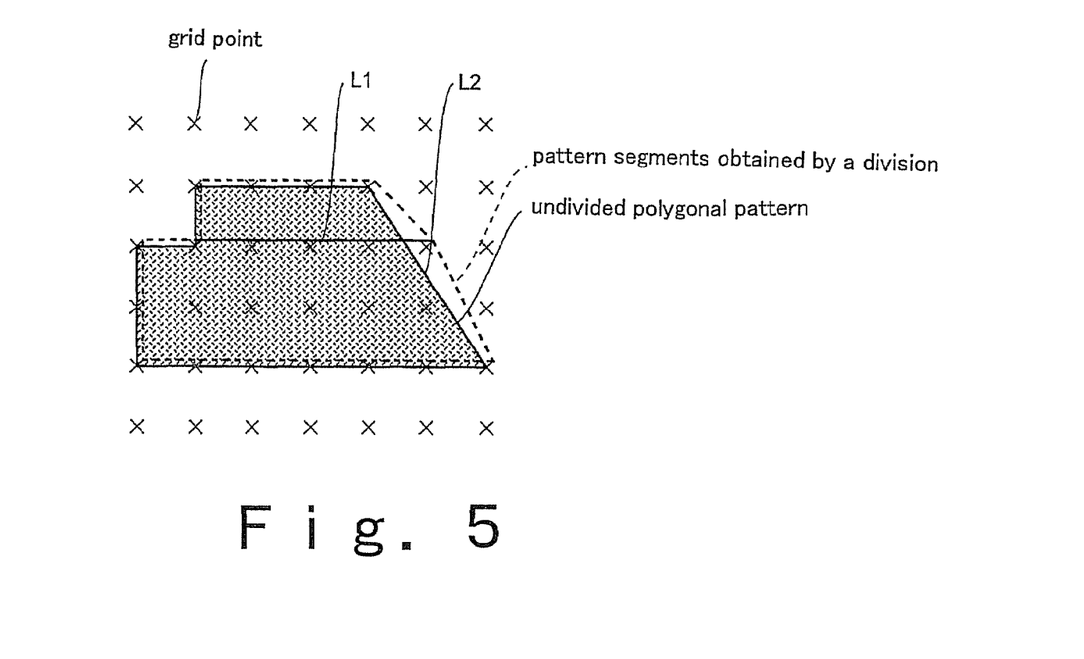
FIG. 5 shows an example in which smoothness of a geometrical figure possessed by an original polygonal pattern is lost by dividing the polygonal pattern into rectangles or trapezoids.

In this charged-particle beam lithography system, a chip pattern having a polygonal pattern is divided into simple rectangular or trapezoidal pattern segments. The pattern is written on a material according to data about the pattern segments. A triangular pattern segment is recognized as a trapezoidal pattern segment having an upper or lower base having a length equal to 0.

Where a polygonal pattern is divided into rectangular or trapezoidal pattern segments, the smoothness of the original polygonal figure is lost as shown in FIG. 5. In FIG. 5, the solid line indicates the original, undivided polygonal pattern. The broken line indicates pattern segments obtained by a division. The symbol x indicates grid points representing units of measure used where data is created. For ease of understanding, the pattern segments obtained after the division are drawn to be slightly shifted.

As shown in FIG. 5, a division line L1 intersects the hypotenuse L2 of the polygonal pattern. The position of the intersection of L1 and L2 is not always at any one of the grid points of the coordinate system by which the geometrical figure is represented. Rather, the intersection is approximated by the closest grid point, which, in turn, becomes a vertex of a rectangular or trapezoidal pattern segment obtained by the division. That is, it is meant that the original polygonal pattern is not always regained if the rectangular or trapezoidal pattern segments are combined.

Furthermore, in a charged-particle beam lithography system, such as an electron-beam lithography system, movement of the written material is normally utilized in addition to beam deflection to delineate a pattern of a size exceeding the deflection region (e.g., a chip pattern) of the beam deflector.

Where such a pattern delineation is carried out, it is necessary to divide a chip pattern into pattern segments according to each field, where delineation can be performed only by beam deflection without moving the material. This may be hereinafter referred to as field division.

Figure 6:
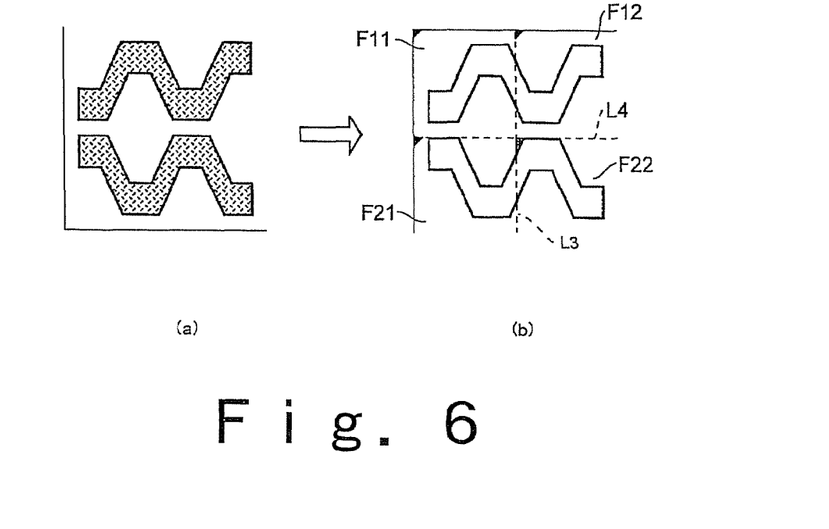
FIG. 6 illustrates a method of dividing a chip pattern according to each field.

This method is illustrated in FIG. 6. When a polygonal pattern as shown at step (a) is divided according to individual fields, a geometry including the fields F11-F22 as shown at step (b) is obtained. The polygonal pattern shown at step (a) is divided by a field boundary line L3 extending in the X-direction and a field boundary line L4 extending in the Y-direction. The symbol ▲ shown in the fields indicates the origins of the fields, i.e., positions of the fields.

We have proposed the following lithography method in order to prevent the smoothness of the original geometrical pattern from being lost due to the division of the chip pattern and to smoothly stitch together pattern segments spanning adjacent fields.

A chip pattern is divided using two kinds of fields which are slightly shifted with respect to each other in field boundary line position. A chip pattern segment obtained in one field is divided into rectangles or trapezoids by line segments extending parallel to the X-axis (hereinafter referred to as the X division). A pattern segment obtained in the other field is divided into rectangles or trapezoids by line segments extending parallel to the Y-axis (hereinafter referred to as the Y division). The pattern segments are overlappingly written at the same position on the same material with an electron beam dose that is a half of the dose normally used. This is hereinafter referred to as the XY overlap lithography.

Figure 7:
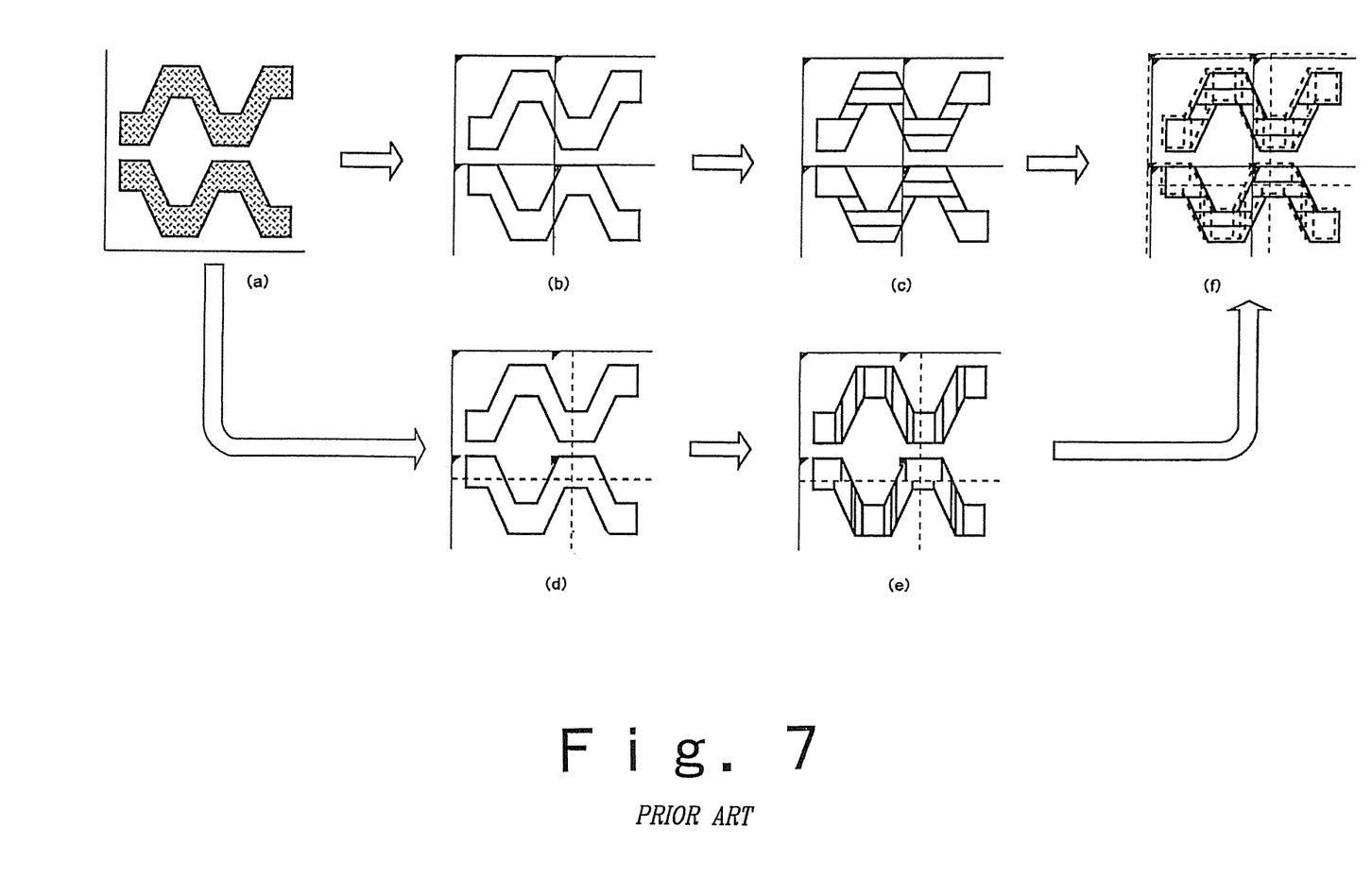
FIG. 7 illustrates an example of a prior art XY overlap lithography method.

The prior art XY overlap lithography is illustrated in FIG. 7. A case in which a polygonal pattern as shown at step (a) is delineated is now assumed. The pattern is divided into pattern segments by a first method of field division as shown at step (b). The pattern segments are divided by X division to obtain a geometry as shown at step (c).

On the other hand, the same polygonal pattern shown at step (a) is divided using a field having a field boundary line slightly shifted with respect to the field boundary line of the field shown at step (b) as shown at step (d). This method of division is referred to as the second method of division. The resulting pattern segments are divided by Y division to obtain a geometry as shown at step (e).

The geometries shown at steps (c) and (e) are laid to overlap each other and delineated lithographically. As a result, a lithographic pattern as shown at step (f) is obtained. Also, in this case, for ease of understanding, the finally obtained pattern is drawn to be shifted slightly.

Where a pattern is written on a material by deflecting an electron beam, beam deflection distortion is induced. The magnitude of the beam deflection distortion varies depending on the position within the field. Therefore, the positional accuracy and dimensional accuracy of the delineated pattern vary depending on the position within the field at which the pattern is delineated. Generally, the beam deflection distortion is smaller at the center of the field and larger at marginal portions.

Figure 8:
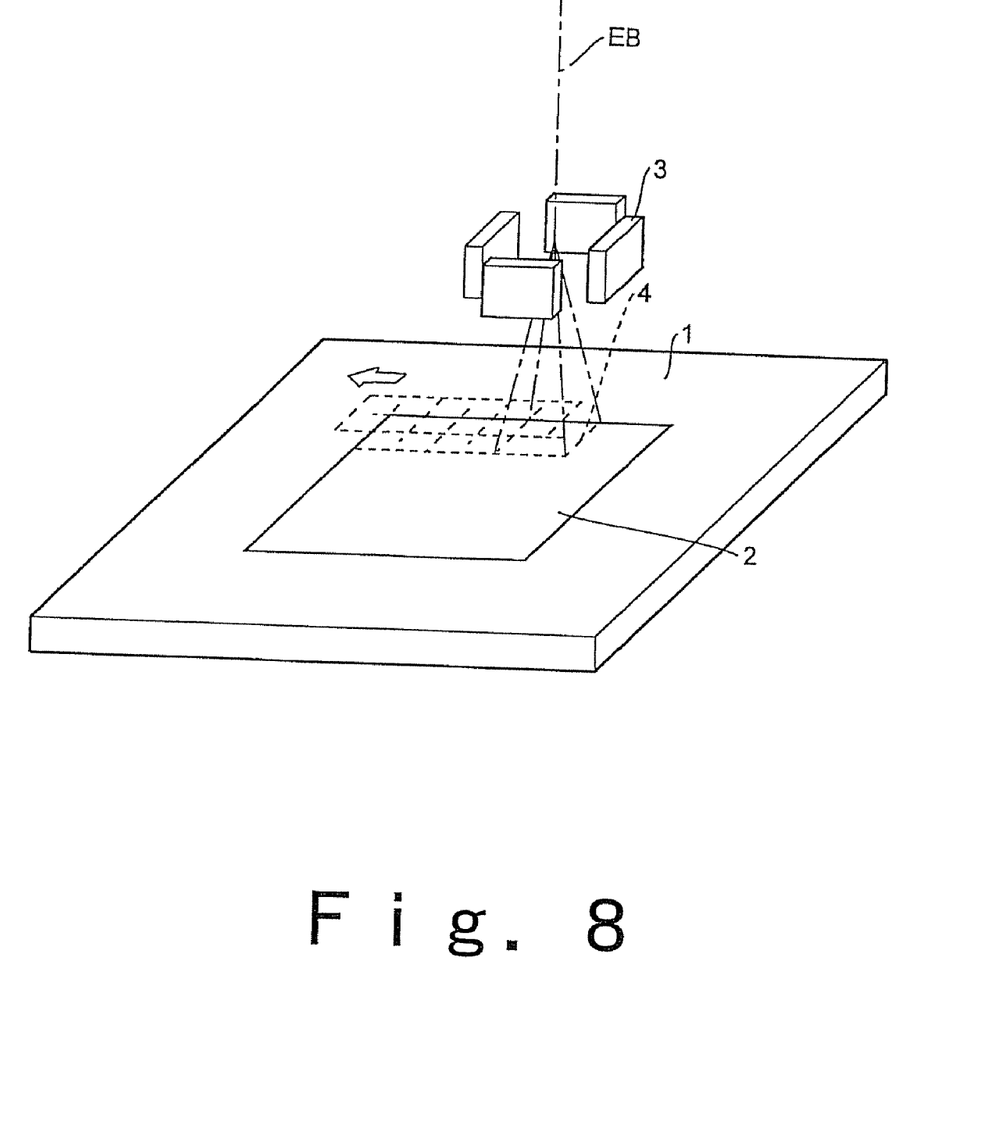
FIG. 8 is a perspective view of a part of an electron-beam lithography system.

FIG. 8 is a perspective view of a part of an electron-beam lithography system. A chip pattern 2 is delineated on a material 1 (such as a photosensitive material). An electron beam deflector 3 deflects the electron beam EB to write the pattern on the material 1. A field 4 indicates a range in which lithography can be performed only by deflection of the beam EB. The material 1 is moved in the direction indicated by the arrow.

If pattern segments spanning adjacent fields are written by such an electron-beam lithography system within each field, the smoothness of stitching between the pattern segments spanning the adjacent fields is deteriorated due to the positional accuracies and dimensional accuracies in the fields.

Figure 9:
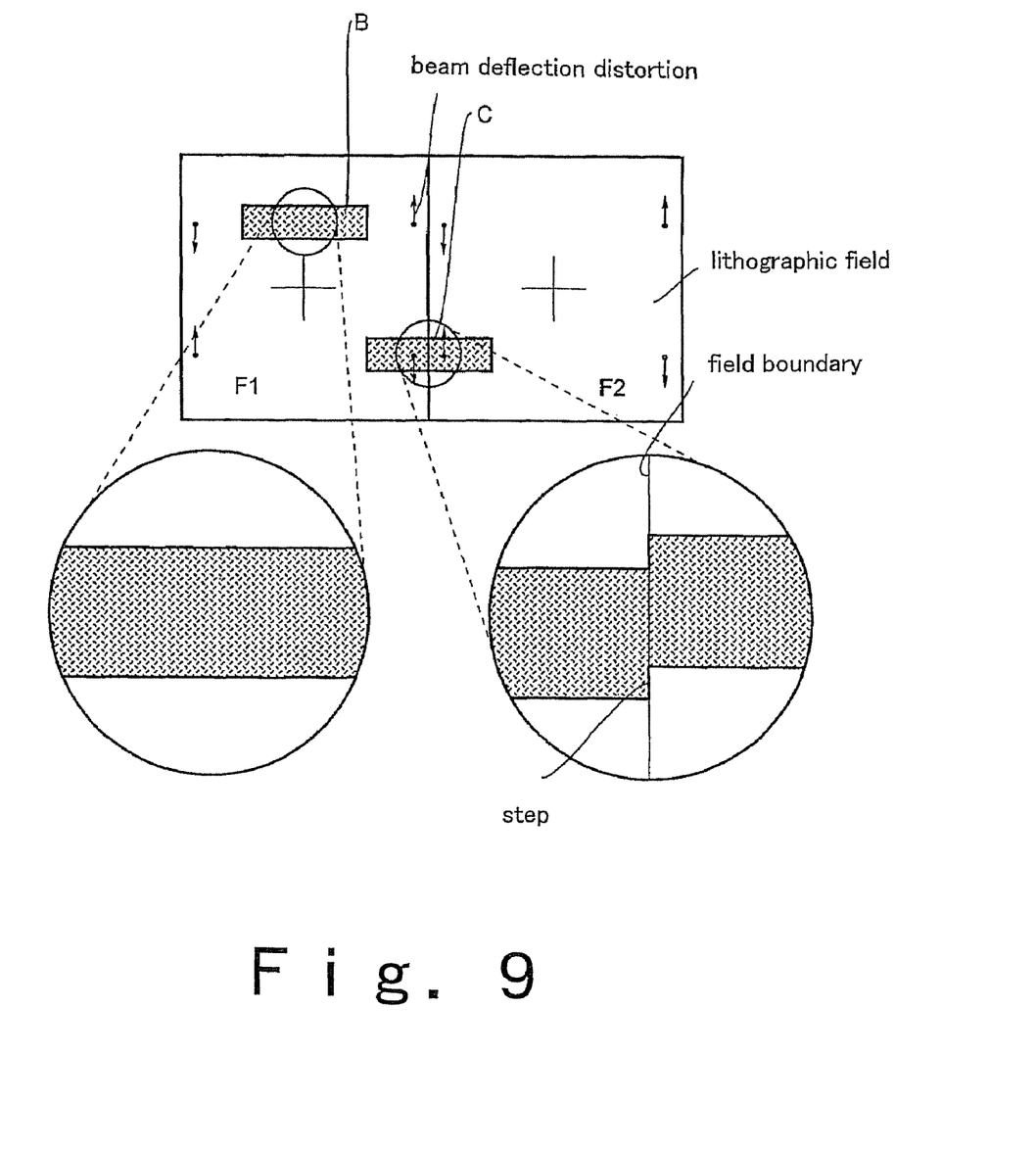
FIG. 9 illustrates the manner in which a pattern is delineated across fields.

FIG. 9 shows the manner in which patterns are written across fields. Lithographic fields F1 and F2 are present on a material. The black arrows indicate beam deflection distortion. In the case of a pattern delineated at or near the center of a field as indicated by B, no step is produced. In contrast, steps are produced on a pattern delineated across fields as indicated by C.

It is difficult to completely remove the beam deflection distortion in such a field. It is necessary to suppress variations in positional accuracy and dimensional accuracy of pattern due to such beam deflection distortion by some additional method.

However, in the above-described method of XY overlap lithography, the positions in the fields where pattern segments obtained respectively by X division and Y division are delineated are different only slightly. Consequently, the process is greatly affected by the beam deflection distortion.

SUMMARY OF THE INVENTION

It is an object of the present invention to provide a method of delineating a pattern under reduced effects of beam deflection distortion.

The present invention provides a method of writing a desired pattern by preparing a material on which a photosensitive material is applied and irradiating the photosensitive material with a charged-particle beam. The method starts with dividing a pattern to be delineated into pattern segments according to first fields by a first method of division. The pattern segments contained in the first fields are divided in a first direction to obtain a first kind of pattern subsegments. Data about the first kind of pattern subsegments is obtained. The pattern to be delineated is divided according to second fields by a second method of division such that the second fields are shifted with respect to the first fields. Pattern segments contained in the second fields are divided in a second direction perpendicular to the first direction to obtain a second kind of pattern subsegments. Data about the second kind of pattern subsegments is obtained. Each of the pattern segments based on the data about the first and second divisions is delineated with a dose that is a half of the dose with which the photosensitive material is exposed. The fields are so divided that a pattern segment located across a field boundary during implementation of one of the first and second methods of division is located around the center of a field during implementation of the other method of division.

In one feature of the present invention, fields obtained by the first method of division and fields obtained by the second method of division are stored in a memory in order to reduce the difference between field positions used when pattern segments are written continuously. The fields are read from the memory in that order.

The present invention can suppress variations in positional accuracy and dimensional accuracy of pattern due to beam deflection distortion. Especially, pattern segments located across a field boundary can be stitched together smoothly.

When a pattern segment is delineated in the next field after a motion of the stage, the next lithography step can be started after a short wait time.

These and other objects and advantages of the present invention will become more apparent as the following description proceeds.

DESCRIPTION OF THE PREFERRED EMBODIMENTS

The preferred embodiments of the present invention are hereinafter described in detail with reference to the accompanying drawings.

Figure 1:
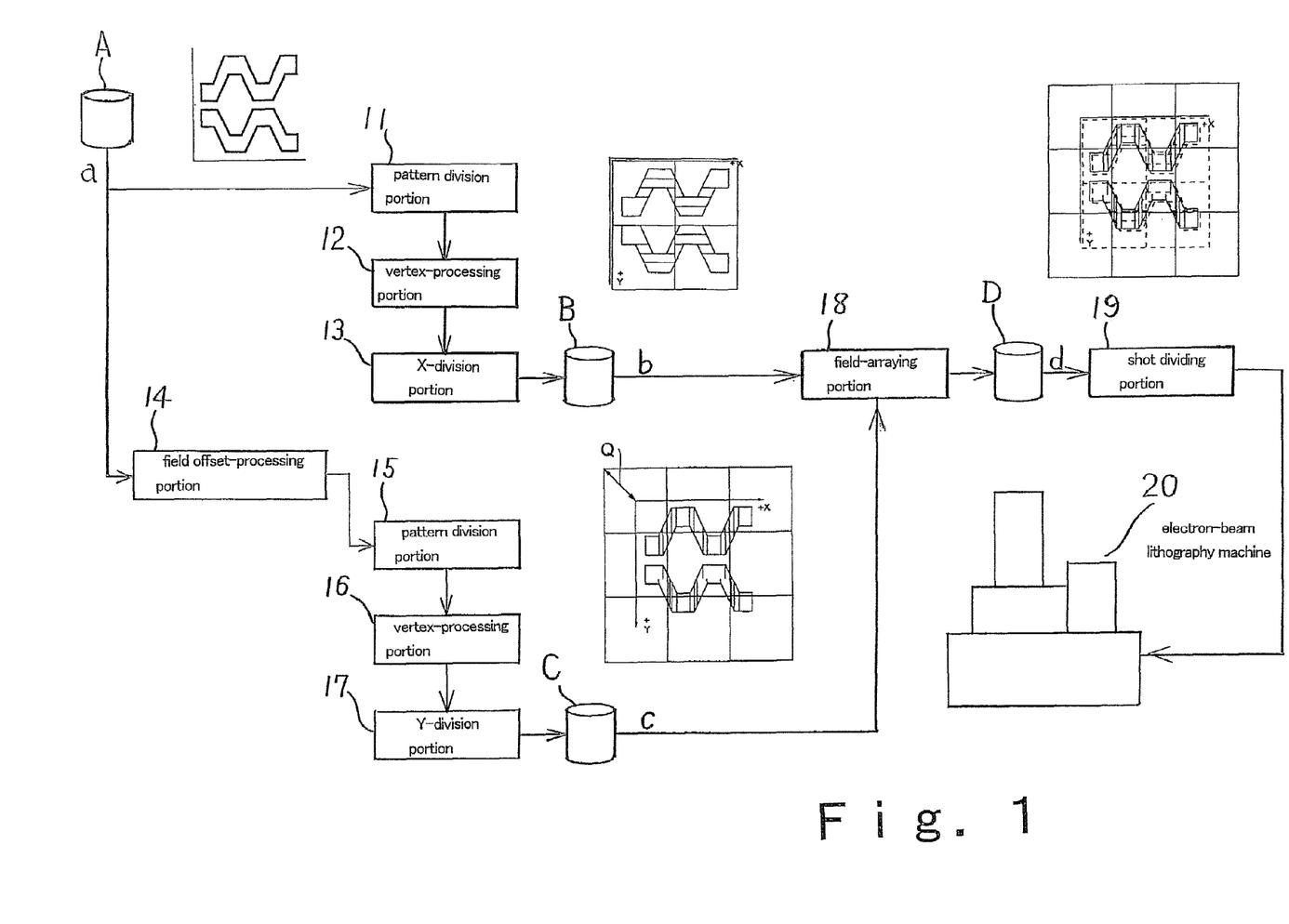
FIG. 1 is a block diagram of an electron-beam lithography system for implementing a method of pattern delineation according to one embodiment of the present invention.

FIG. 1 shows an electron-beam lithography system for implementing a method of pattern delineation according to one embodiment of the present invention.

In FIG. 1, data about a chip pattern having a polygonal pattern created by CAD is stored in a data memory A. The pattern from the data memory A is divided into pattern segments according to individual fields by a pattern division portion 11. A vertex-processing portion 12 finds the coordinates of the vertices of the pattern segments. An X-division portion 13 divides the pattern segments in the X-direction based on the vertices found by the vertex-processing portion 12. This is referred to as the X division. A direction identifier for identifying the direction of division is attached to each set of data about the pattern segments derived by the X division. The obtained data, indicated by b, including the direction identifiers is stored in a second data memory B.

A field offset-processing portion 14 adds offset data to the pattern data a from the data memory A. A pattern division portion 15 divides a pattern to which the offset data has been added into pattern segments according to individual fields. A vertex-processing portion 16 finds the coordinates of the vertices of the pattern segments. A Y-division portion 17 divides the original polygonal pattern in the Y-direction, based on the vertices found by the vertex-processing portion 16 (referred to as the Y division). A direction identifier for identifying a direction of division is added to each set of data about the pattern segments derived by the Y division. Data c is obtained by adding the direction identifiers to data about pattern segments obtained by the Y division, and is stored in a third data memory C.

A field-arraying portion 18 combines the data b about the pattern segments obtained by the X division and the data c about the pattern segments obtained by the Y division and aligns the fields to perform lithography in each field at high speed. Data about the pattern segments derived from the field-arraying portion 18 is stored in a fourth data memory D.

A shot dividing portion 19 divides the data d from the data memory D (data b and c) into the data having size corresponding to the size of an actually shot beam. A well-known electron-beam lithography machine 20 (a part of which is shown in FIG. 8) is used to delineate a desired pattern at a given position on a material, based on pattern data from the shot dividing portion 19.

Data is stored into and read from the data memories A, B, C, and D under control of a central processing unit (CPU) (not shown). Furthermore, all of the pattern division portions 11, 15, vertex-processing portions 12, 16, X-division portion 13, Y-division portion 17, offset-processing portion 14, field-arraying portion 18, shot dividing portion 19, and electron-beam lithography machine 20 operate based on instructions given from the CPU. The electron-beam lithography system constructed in this way operates as follows.

The chip pattern data a from the data memory A is processed through two routes as shown and sent to the field-arraying portion 18. In one route, the pattern division portion 11 sets a field position from the origin of the chip for each field size, and produces a field at the boundary line extending from this field position to an adjacent field position.

The chip pattern about which data is supplied from the data memory A is cut at or near the boundary line of the produced field. The chip pattern is cut near the field boundary line such that a pattern slightly shifted to the right, for example, is lithographically written in the left field.

Then, the vertex-processing portion 12 acquires information about the positions of the vertices of pattern segments derived according to the individual fields. The following X-division portion 13 divides the polygonal pattern into rectangles or trapezoids by line segments extending from the vertices in a parallel relation to the X-axis based on the acquired information about the vertices. The X-division portion 13 outputs data b about the rectangles or trapezoids obtained by the X division.

In the other route, the field offset-processing portion 14 gives field offset Q to the field data as shown. Then, the pattern division portion 15 sets a chip origin that is different from the origin of the field produced by the pattern division portion 11 by the amount of the offset. Then, the pattern division portion 15 sets a field position from the chip origin for each field size, and generates a field at a boundary line extending from the set field position to an adjacent field position.

Thereafter, the pattern division portion 15 cuts the chip pattern, about which data a is derived from the data memory A, at or near the boundary line of the generated field. The vertex-processing portion 16 acquires the coordinates of the positions of the vertices of pattern segments obtained after the field division. The Y-division portion 17 divides the polygonal pattern into rectangles or trapezoids with line segments extending from the vertices in a parallel relation to the Y-axis, based on the acquired information about the vertices, and sends out data c about the pattern segments obtained by the Y division.

At this time, the field offset-processing portion 14 operates in such a way that the positions of the fields produced by the field division portions 15 and 11, respectively, are not slightly but greatly different. The difference between the field positions is adjusted by the magnitude of the field offset Q. The adjustment is so made that a pattern located at the boundary of fields in one field division is located around the center of a field in the other field division, and vice versa.

Then, the field-arraying portion 18 combines the data b (about the pattern segments obtained by the X division) from the data memory B and the data c (about the pattern segments obtained by the Y division) from the data memory C into one set of pattern segment data d and sends the data d to the data memory D. During the combination, the order of array of the fields is so set that the difference in position between the produced fields is reduced to a minimum.

Generally, whenever a different pattern segment is delineated on a material for one field, the stage is moved. If the motor driving the stage is brought to a stop, the stage is not immediately stopped but comes to a stop after making a minute motion. Delineation of a pattern segment for the next field is started after the wait time that starts at the beginning of motion of the stage and ends upon termination of the motion of the stage. This wait time corresponds to the distance traveled. Accordingly, the field-arraying portion 18 rearranges the fields so as to shorten the distance traveled by the stage at delineation for the next field in order to shorten the wait time.

Figure 2:
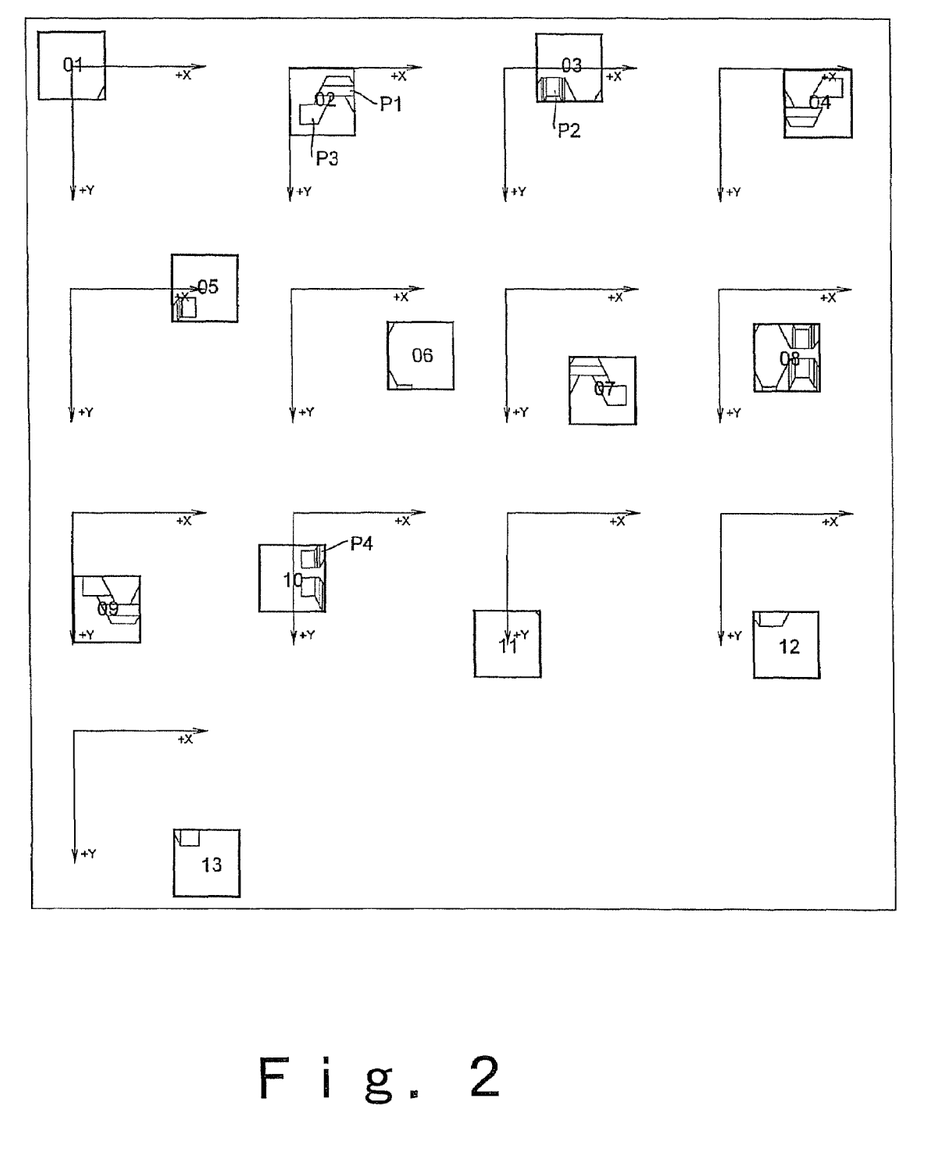
FIG. 2 illustrates order of array of fields in a case where two kinds of field division are performed by a method of pattern delineation according to one embodiment of the present invention.

FIG. 2 illustrates the order of arrangement of the fields. Numerals 01 to 13 indicate the order of arrangement of the fields. Data about a pattern segment is stored in the data memory D in this order for each field.

As shown in FIG. 2, the data b about the pattern segments obtained by the X division and the data c about the pattern segments obtained by the Y division are intermingled. For example, a numeral set 02 indicates a set of data about a pattern segment that is open in the X-direction. A numeral set 03 indicates a set of data about a pattern segment that is open in the Y-direction. A pattern segment P1 bearing the numeral set 02 corresponds to pattern segment P2 bearing the numeral set 03. A pattern segment P3 bearing the numeral set 02 corresponds to the pattern segment P4 bearing a numeral set 10.

Then, the shot dividing portion 19 divides the data d from the data memory D (data b and c) into the data having size corresponding to the size of the actually shot beam. The electron-beam lithography machine 20 delineates a pattern in the fields on the material by moving the material in the order of arrangement determined by the field-arraying portion 18.

At this time, the electron-beam lithography machine 20 delineates the pattern segments obtained by the X-division and Y-division, respectively, on the same location in an overlapped manner with an electron beam dose that is a half of the dose normally used, under control of the CPU (not shown). It follows that the pattern to be delineated is written at the same electron beam dose as the dose normally used.

Figure 3:
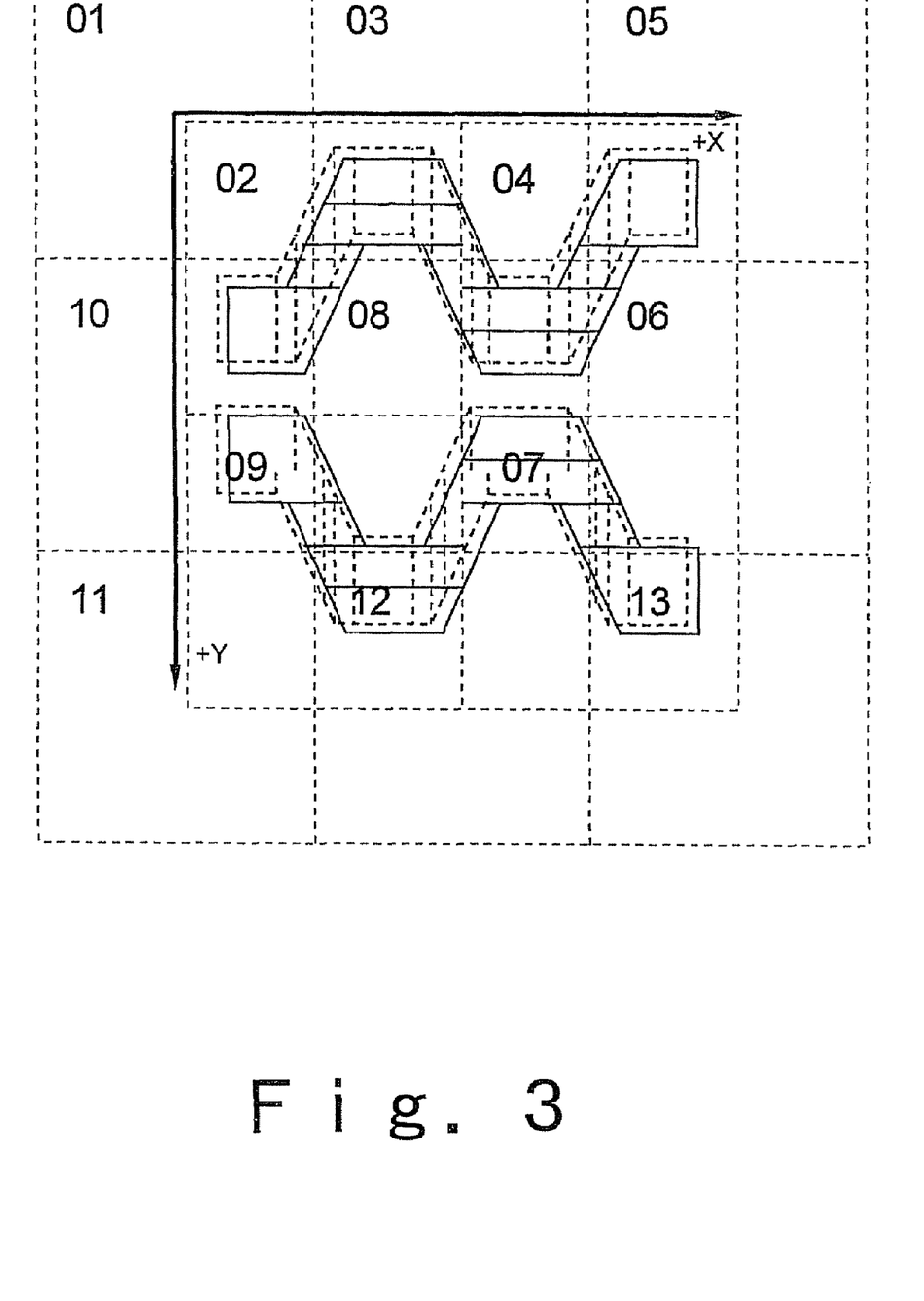
FIG. 3 illustrates an example of method of delineating pattern segments in each field after two kinds of field division are performed by a method of pattern delineation according to one embodiment of the present invention.

In this way, two kinds of field division are carried out. A pattern segment is delineated for each field. The result is shown in FIG. 3. The numerals shown in the figure indicate the order of delineation in the fields. The pattern shown in FIG. 3 corresponds to the pattern shown in FIG. 2.

In this way, all of the pattern to be delineated is written at positions that are greatly different between two fields. Specifically, where a pattern segment obtained by X division or Y division is delineated within any one field, a pattern segment delineated around a field boundary that is more affected by beam deflection distortion is also delineated near the center of the other field that is less affected by the beam deflection distortion. Both kinds of pattern segment are written in an overlapped manner. In consequence, the effects of the beam deflection distortion can be averaged out.

Figure 4:
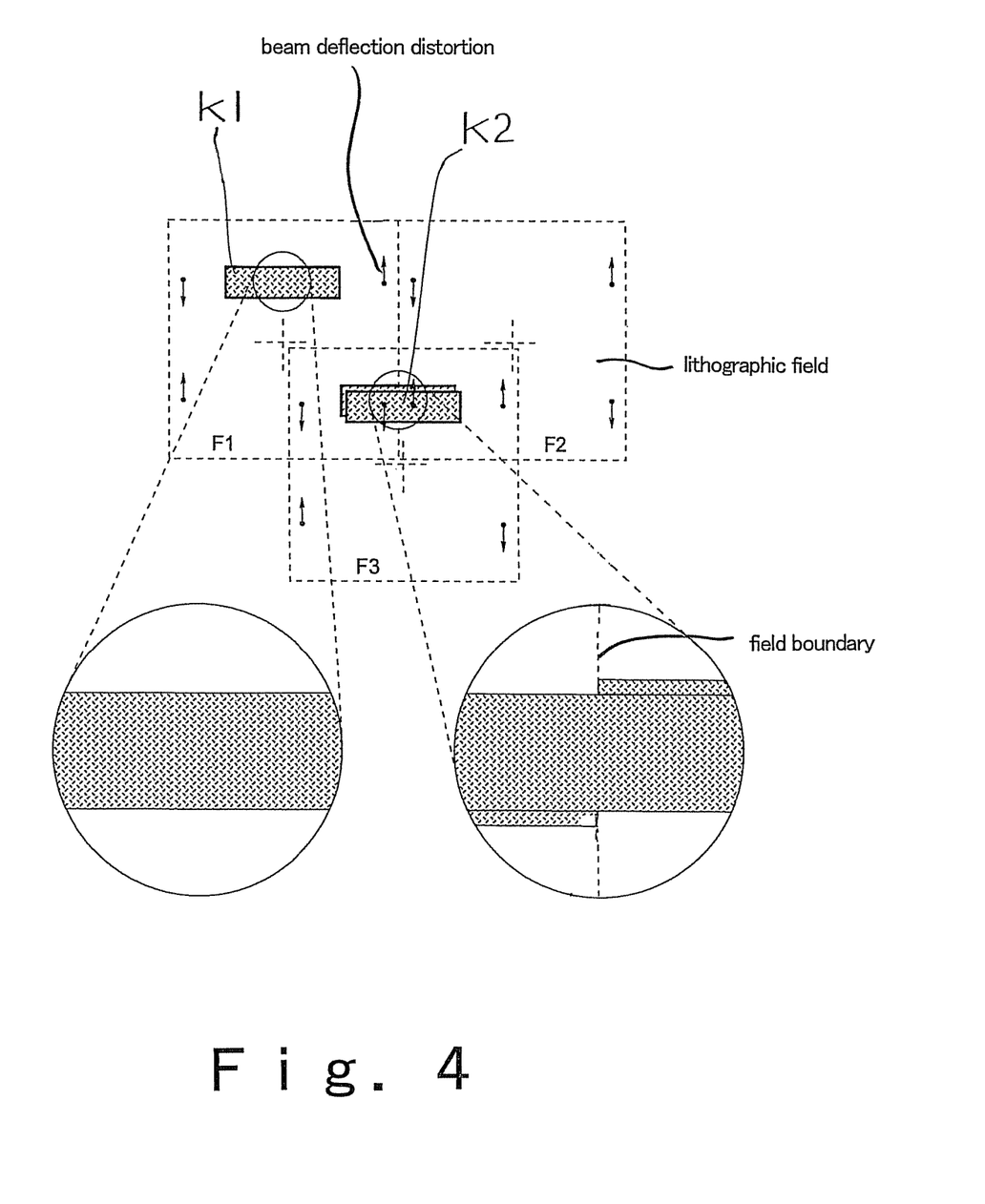
FIG. 4 shows examples of patterns including a pattern delineated across fields.

FIG. 4 shows patterns including a pattern delineated across fields. In this figure, fields F1-F3 are present on a material. The arrows each with a black dot indicate beam deflection distortion. In the lithographic field F1, a pattern K1 is written without crossing any field boundary. Of course, there is no stitch. In contrast, a pattern K2 is written across a field boundary. A step produced at the field boundary in one field lithography step and a step produced in the other field lithography step containing no field boundary are smoothed out by means of overlapping lithography. As a result, even a pattern or pattern segment laid across adjacent fields is delineated smoothly.

In the description made in connection with FIG. 1, a field offset is added when a Y division is performed. The present invention is not limited to this method. For example, a pattern may be divided in the Y-direction according to individual fields, and a field offset division may be performed in the X-direction.

Having thus described my invention with the detail and particularity required by the Patent Laws, what is desired protected by Letters Patent is set forth in the following claims.

The invention claimed is:

1. A method of writing a desired pattern by preparing a material on which a photosensitive material is applied and irradiating the photosensitive material with a charged-particle beam, said method comprising the steps of:

dividing a pattern to be delineated into pattern segments according to first fields by a first method of division;

dividing the pattern segments contained in the first fields in a first direction to obtain first sets of pattern subsegment data;

dividing the pattern to be delineated according to second fields by a second method of division such that the second fields are shifted with respect to the first fields;

dividing pattern segments contained in the second fields in a second direction perpendicular to the first direction to obtain second sets of pattern subsegment data; and delineating the pattern subsegments based on the first and second sets of pattern subsegment data with a dose that is a half of a dose with which the photosensitive material is normally exposed, wherein the fields are so divided that a pattern segment located across a field boundary during implementation of one of the first and second methods of division is located around the center of a field during implementation of the other method of division.

2. A method of writing a desired pattern as set forth in claim 1, wherein fields produced by the first method of division and fields produced by the second method of division are stored in a memory in order of reducing the difference between field positions used when pattern segments are written continuously, and wherein the fields are read from the memory in that order.

* * * * *